(12) United States Patent  
Kawaguchi et al.

(10) Patent No.: US 9,611,115 B2  
(45) Date of Patent: Apr. 4, 2017

(54) TAPE FEEDER

(71) Applicant: Panasonic Intellectual Property Management Co., Ltd., Osaka (JP)

(72) Inventors: Satoshi Kawaguchi, Yamanashi (JP); Tatsuo Yamamura, Fukuoka (JP); Shigeru Matsukawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 71 days.

(21) Appl. No.: 14/647,548

(22) PCT Filed: Nov. 27, 2013

(86) PCT No.: PCT/JP2013/006985  
§ 371 (c)(1),  
(2) Date: May 27, 2015

(87) PCT Pub. No.: WO2014/083852  
PCT Pub. Date: Jun. 5, 2014

(65) Prior Publication Data  
US 2015/0319892 A1 Nov. 5, 2015

(30) Foreign Application Priority Data

Nov. 28, 2012 (JP) .................................. 2012-259345  
May 21, 2013 (JP) .................................. 2013-106883

(51) Int. Cl.  
*B65H 20/20* (2006.01)  
*H05K 13/02* (2006.01)  
*H05K 13/04* (2006.01)

(52) U.S. Cl.  
CPC ............. *B65H 20/20* (2013.01); *H05K 13/02* (2013.01); *H05K 13/0417* (2013.01)

(58) Field of Classification Search  
CPC ......... B65H 20/20; B65H 20/22; H05K 13/02  
See application file for complete search history.

(56) References Cited

U.S. PATENT DOCUMENTS

2012/0305585 A1  12/2012  Nagao

FOREIGN PATENT DOCUMENTS

| CN | 102783265 A | 11/2012 |
|---|---|---|
| EP | 1265474 A1 | 12/2002 |

(Continued)

OTHER PUBLICATIONS

Machine translation of JP 2008-277350, retrieved Oct. 1, 2016.*

(Continued)

*Primary Examiner* — Michael McCullough  
(74) *Attorney, Agent, or Firm* — Pearne & Gordon LLP

(57) ABSTRACT

A tape feeder includes: a feeder bottom support that rotatably holds a sprocket; and a tape presser mechanism that presses a carrier tape toward the feeder bottom support. The tape presser mechanism includes a tape presser that is at one end pivotally supported by the feeder bottom support and swingable to the feeder bottom support and that presses the carrier tape toward the sprocket while situated at a close position where the tape presser is closed to the feeder bottom support, and a tape presser operation member that is swingably attached to the feeder bottom support and that swings between a fixed position where the tape presser operation member presses the other end of the tape presser toward the feeder bottom support and an unfixed position where the other end of the tape feeder is released from pressure.

6 Claims, 16 Drawing Sheets

(56) References Cited

FOREIGN PATENT DOCUMENTS

| | | |
|---|---|---|
| JP | 05-110287 A | 4/1993 |
| JP | 2001-196789 A | 7/2001 |
| JP | 2006-156514 A | 6/2006 |
| JP | 3980621 B2 | 7/2007 |
| JP | 2008-277350 A | 11/2008 |
| JP | 2009-140994 A | 6/2009 |
| WO | 2008/078647 A1 | 7/2008 |

OTHER PUBLICATIONS

International Search Report for Application No. PCT/JP2013/006985 dated Feb. 10, 2014.
Notification of First Office Action issued in Chinese Patent Application No. 201380062143 dated Aug. 31, 2016.

* cited by examiner

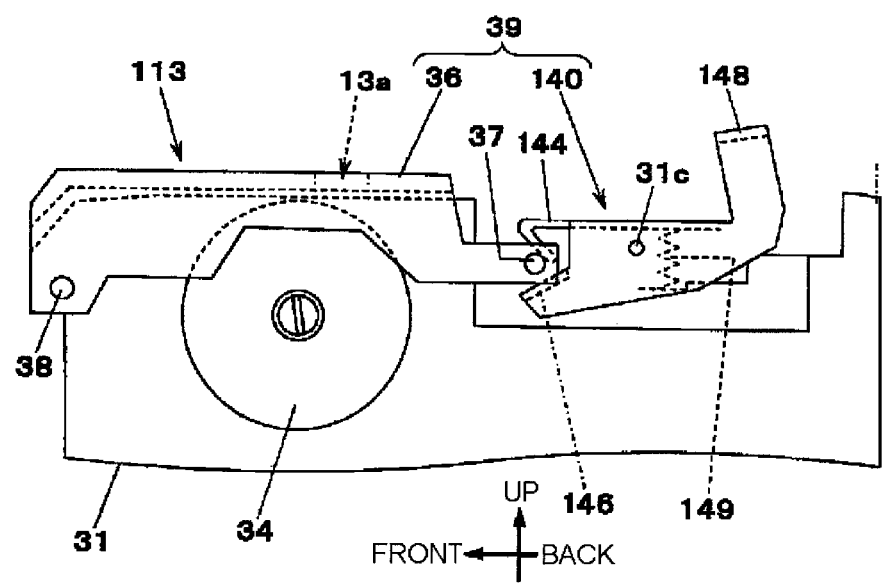
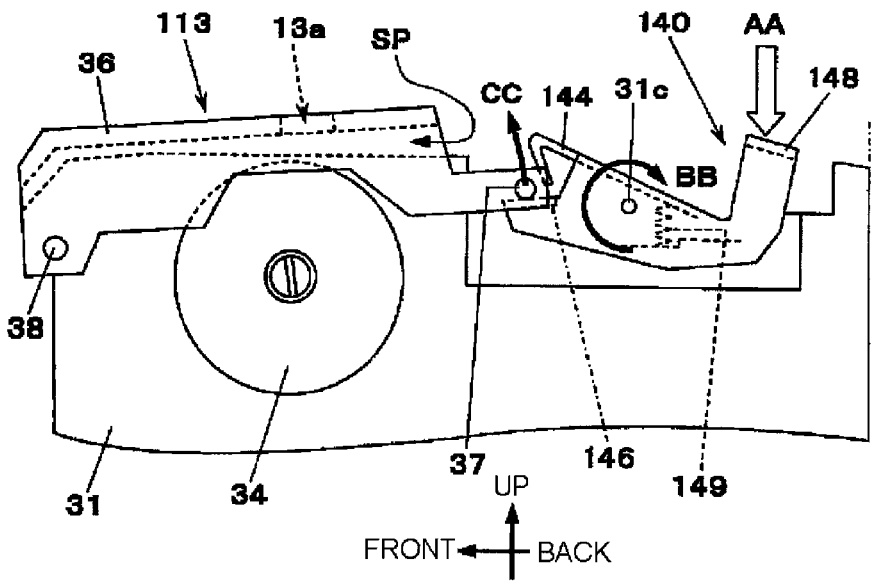

TAPE FEEDER

TECHNICAL FIELD

The present invention relates to a tape feeder that is attached to a component mounting apparatus to feed components.

BACKGROUND ART

A tape feeder, which is known as one of parts feeders that feed components to a component mounting apparatus, rotates a sprocket with feed pins of its outer circumference engaged with sprocket holes of a carrier tape, thereby performing operation for feeding the carrier tape. The tape feeder is equipped with a tape presser for pressing toward the sprocket a curled carrier tape drawn from a reel. By means of the tape presser, the sprocket's feed pins are brought into reliable engagement with the sprocket holes of the carrier tape.

In some of tape presser mechanisms equipped with the tape presser, an end of the tape presser by way of which the carrier tape is inserted into the tape presser mechanism is pushed toward the sprocket, thereby putting a limit on an opening angle of the tape presser (see Patent Literature 1). Such a configuration makes it possible to put a fixed limit on spacing between the tape presser and the sprocket, yielding an advantage of even the curled carrier tape drawn from the reel being able to easily engage with the pins of the outer circumference of the sprocket.

CITATION LIST

Patent Literature

[PTL 1] JP-A-2009-140994

SUMMARY OF INVENTION

Technical Problem

However, a tape presser operation section used for operating the tape presser in its opening direction is also provided integrally on the tape presser. In order to open up the tape presser, the tape presser operation section needs to be pushed up by force that is greater than biasing force of a biasing spring. In addition, the spacing between the tape presser and the sprocket becomes narrow because of the fixed limit on the opening angle of the tape presser, which poses difficulty in attaching the carrier tape.

Accordingly, the present invention aims at providing a tape feeder that facilitates operation for attaching a carrier tape to thus enhance workability.

Solution to Problem

There is provided a tape feeder that rotates a sprocket with feed pins of an outer circumference of the sprocket engaged with sprocket holes of a carrier tape to feed the carrier tape, the tape feeder including: a feeder bottom support that rotatably holds the sprocket and that has a sprocket drive section that rotationally drives the sprocket; and a tape presser mechanism that presses the carrier tape toward the feeder bottom support, wherein the tape presser mechanism includes a tape presser that is at one end pivotally supported by the feeder bottom support and swingable with respect to the feeder bottom support and that presses the carrier tape toward the sprocket while situated at a close position where the tape presser is closed with respect to the feeder bottom support, and a tape presser operation member that is swingably attached to the feeder bottom support and that swings between a fixed position where the tape presser operation member presses the other end of the tape presser toward the feeder bottom support to fix the tape presser at the close position and an unfixed position where the other end of the tape feeder is released from pressure, and, when the tape presser operation member is swung to the unfixed position from the fixed position, the tape presser operation member lifts up the other end of the tape presser from below to form a carrier tape insertion space that enables insertion of the carrier tape between the tape presser and the feeder bottom support.

In the tape feeder, an end of the tape presser operation member near the other end of the tape presser may be forced downwardly by a biasing member provided between the feeder bottom support and the tape presser operation member, and the end of the tape presser operation member may have a press portion that presses the other end of the tape presser and a lift portion that lifts the other end of the tape presser.

In the tape feeder, the tape presser operation member may include a regulation portion, and the tape presser may be movable from a state where the tape presser operation member is situated at the unfixed position to further in a direction of opening with respect to the feeder bottom support until the tape presser comes into contact with the regulation portion.

In the tape feeder, the press portion of the tape presser operation member may assume a shape such that the press portion does not interfere with the tape presser which swings from the close position in a direction of opening with respect to the feeder bottom support while the tape presser operation member is situated at the unfixed position and that the press portion interferes with the tape presser which swings toward the close position from a position where the tape presser is opened with respect to the feeder bottom support while the tape presser operation member is situated at the fixed position.

Advantageous Effects of Invention

In the present embodiments, a tape presser mechanism which presses a carrier tape toward a feeder bottom support includes a tape presser that is at one end pivotally supported by the feeder bottom support and swingable with respect to the feeder bottom support and that presses the carrier tape toward a sprocket while the tape presser is situated at a close position where the tape feeder is closed with respect to the feeder bottom support. The tape presser mechanism further includes a tape presser operation member that is swingably attached to the feeder bottom support and that swings between a fixed position where the tape presser is fixed to the close position with its other end pressed toward the feeder bottom support and the unfixed position where the other end of the tape feeder is released from the pressure. The tape presser and the tape presser operation member for actuating the tape presser are configured separately from each other. Consequently, force required to operate the tape presser in a direction of opening with respect to the feeder bottom support can be diminished, and operation for bringing the carrier tape into engagement with the sprocket is facilitated, thereby enabling enhancement of workability.

BRIEF DESCRIPTION OF DRAWINGS

FIGS. 13A and 13B are partially side views of the tape feeder of the second embodiment of the present invention;

DESCRIPTION OF EMBODIMENTS

First Embodiment

Figure 1:
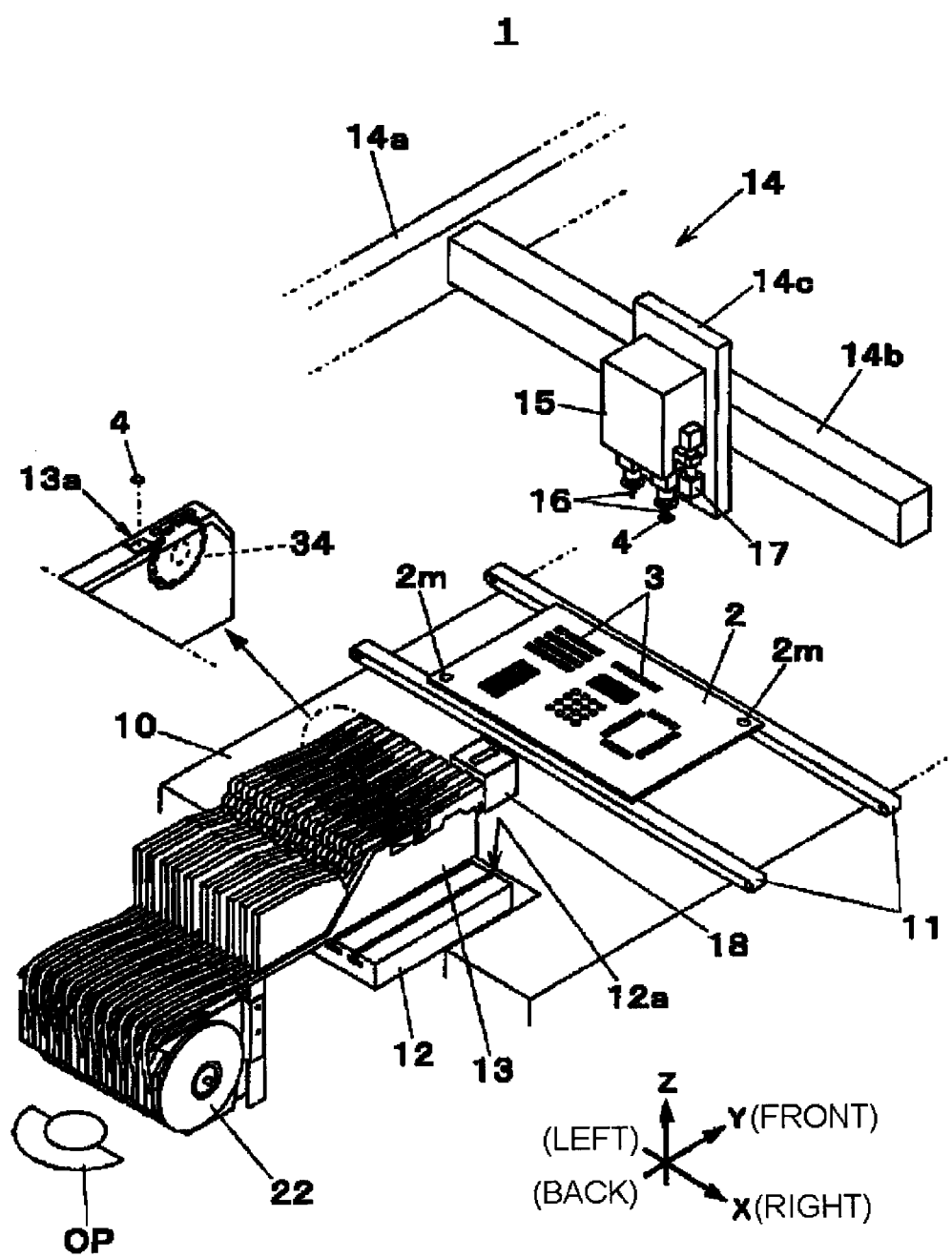
FIG. 1 is a perspective view of a main section of a component mounting apparatus of a first embodiment of the present invention.

A component mounting apparatus 1 of a first embodiment of the present invention illustrated in FIG. 1 is an apparatus that carries a substrate 2 in, positions the substrate 2, and mounts components 4 on electrode sections 3 of the thus-positioned substrate 2.

In FIG. 1, the component mounting apparatus 1 has a substrate transport conveyor 11 that transports the substrate 2 to a center of a base 10 along one direction (a right-left direction, when viewed from an operator OP, taken as an X-axis direction) within a horizontal plane. A plurality of tape feeders 13 serving as component feed sections for feeding the components 4 are respectively, removably attached, in a horizontal direction (a front-back direction, when viewed from the operator OP, hereinafter taken as a Y-axis direction) orthogonal to the X-axis direction, to a feeder base 12 disposed on a lateral part of the substrate transport conveyor 11 on the base 10.

A head moving mechanism 14 made up of an orthogonal coordinate robot is placed at an elevated location above the base 10, and amount head 15 is moved within a horizontal plane by the head moving mechanism 14. The head moving mechanism 14 is made up of a Y-axis table 14a that is fixed on the base 10 and that extends in the Y-axis direction; an X-axis table 14b that is moved along the Y-axis table 14a and that extends in the X-axis direction, and a moving stage 14c that is moved along the X-axis table 14b. The mount head 15 is attached to the moving stage 14c. A plurality of pickup nozzles 16 that pickup the components 4 by vacuum suction are attached to the mount head 15 so as to be movable along the vertical direction (hereinafter referred to as a "Z-axis direction") and rotatable around a vertical axis.

The mount head 15 is equipped with a substrate camera having a downward directed imaging field, and a component camera 18 having an upward directed imaging field is placed in an area on the base 10 between the feeder base 12 and the substrate transport conveyor 11.

Figure 2:
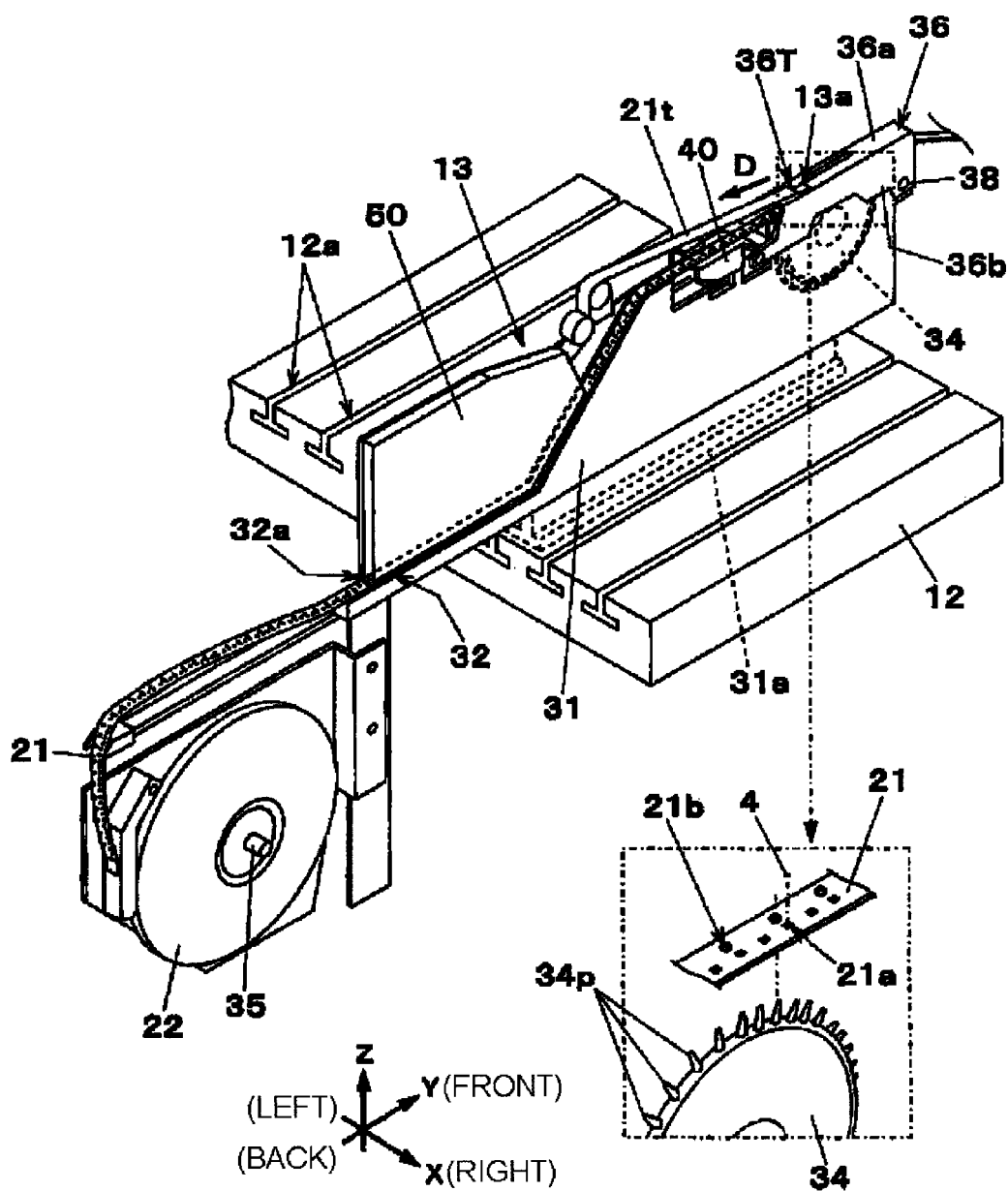
FIG. 2 is a perspective view illustrating a tape feeder along with a feeder base in the first embodiment of the present invention.

In FIG. 2, each of the tape feeders 13 draws and feeds from a reel 22 a carrier tape 21 whose component storages 21a store the respective components 4, continuously feeding the components 4 to a component feed port 13a (see also FIG. 1) without interruption. In the following descriptions about the tape feeder 13, a direction toward a center of the base 10 (i.e., toward the substrate transport conveyor 11) when viewed from the operator OP with the tape feeder 13 attached to the feeder base 12 is hereunder referred to as a "front" of the tape feeder 13, whilst a direction opposite to the front direction (i.e., a direction closer to the operator OP) is hereunder referred to as a "back" of the tape feeder 13. Moreover, a horizontal direction orthogonal to the front-back direction of the tape feeder is hereunder referred to a right-left (lateral) direction of the tape feeder.

Figure 3:
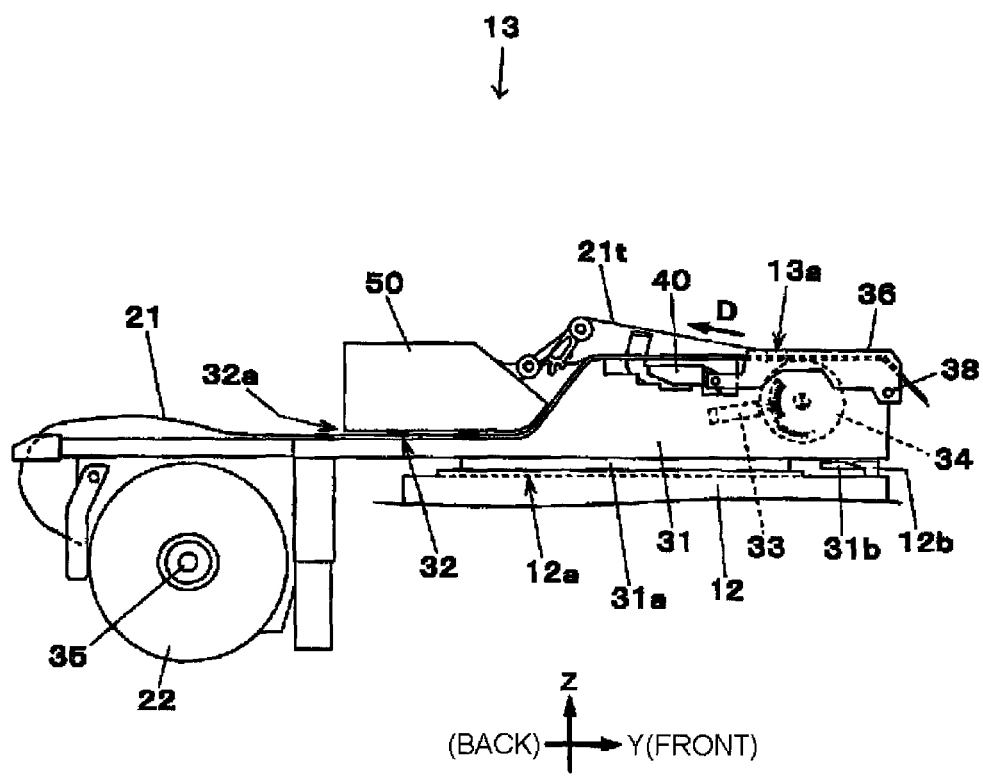
FIG. 3 is a side view of the tape feeder of the first embodiment of the present invention.

In FIGS. 2 and 3, a groove-shaped passage for the carrier tape 21 (hereinafter referred to as a "tape passage 32") is formed, while remaining open in one lateral direction (a rightward direction, in the embodiment, when viewed from the operator OP), in a feeder bottom support 31 which is an area to be removably attached to the feeder base 12 of the tape feeder 13. A sprocket 34 that is rotationally driven by a sprocket drive motor 33 is placed at an elevated location above a front portion of the feeder bottom support 31.

A joint 31a, which is disposed on an underside of the feeder bottom support 31 and which assumes an inverted T-shaped cross sectional profile and extends along a longitudinal direction (i.e., the front-back direction) of the feeder bottom support 31, is inserted into a slot 12a of the feeder base 12 (FIG. 1, FIG. 2, and FIG. 3) along the Y-axis direction, whereby the feeder bottom support 31 is attached to the feeder base 12. As illustrated in FIG. 3, when the feeder bottom support 31 is attached to the feeder base 12, a projection 31b, which is placed at a front end portion of the underside of the feeder bottom support 31 and which projects to the front, comes into contact with from behind a projection contact 12b placed at a front end portion of the feeder base 12, whereby the feeder bottom support 31 is positioned with respect to the feeder base 12.

In FIG. 2 and FIG. 3, a shaft-shaped reel holder 35, which extends in its lateral direction and which rotatably holds a center of the reel 22, is disposed at a lower portion of a rear end of the feeder bottom support 31. The carrier tape 21 drawn from the reel 22 held by the reel holder 35 enters the tape passage 32 via a tape inlet 32a on the rear end of the feeder bottom support 31 to be led up to a position above the sprocket 34 situated at the elevated location above the front portion of the feeder bottom support 31.

Sprocket holes 21b are placed at given spaces on the carrier tape 21 in its longitudinal direction (an enlarged view of FIG. 2), and feed pins 34p provided on an outer circumference of the sprocket 34 come into engagement with one of the sprocket holes 21b situated immediately above the sprocket 34. The sprocket 34 is rotationally driven by the sprocket motor 33, thereby pulling the carrier tape 21 and letting the carrier tape 21 travel from a rear end side to a front end side of the feeder bottom support 31 through the inside of the tape passage 32 of the feeder bottom support 31.

As above, each of the tape feeders 13 has the feeder bottom support 31 that rotatably holds the sprocket 34 and that is equipped with the sprocket drive motor 33 serving as a sprocket drive section which rotationally drives the sprocket 34. The sprocket 34 with the feed pins 34p of its outer circumference in engagement with the sprocket holes 21b of the carrier tape 21 is rotated to thus feed the carrier tape 21.

In FIG. 2, a tape presser 36 is placed at a position to that covers, from above, a space over the sprocket 34 in the feeder bottom support 31. The tape presser 36 has an upper surface portion 36a and a pair of side surface portions 36b. The upper surface portion 36a is extended along the front-back direction of the tape feeder 13, and the component feed port 13a is formed in the upper surface portion 36a. The pair of side surface portions 36b extend downwards from both laterally-opposed end faces of the upper surface portion 36a. A press receiving shaft 37 links a pair of rear extensions 36c, which extend backwards from respective rear ends of both side surface portions 36b, in a lateral direction of the tape feeder 13.

A front end of the tape presser 36 (in other words, one end of the tape presser 36) is pivotally supported by a pivot 38 over the front end of the feeder bottom support 31, whereby the tape presser 36 is swingable with respect to the feeder bottom support 31.

At a position where the tape presser 36 is closed with respect to the feeder bottom support 31 illustrated in FIG. 2 and FIG. 3 (hereinafter referred to as a "close position"), the tape presser 36 presses a portion of the carrier tape 21, which is situated on the tape passage 32 and in the vicinity of an upper end of the sprocket 34, toward the sprocket 34 (from above). Since the carrier tape 21 is fed while being wound around the reel 22 and hence still remains curled even after being drawn from the reel 22. However, the carrier tape 21 is pressed toward the sprocket 34 by the tape presser 36, whereby a curling around a portion of the carrier tape 21 that engages with the feed pins 34p of the sprocket 34 is straightened. Thus, the feed pins 34p of the sprocket 34 can come into reliable engagement with the sprocket holes 21b of the carrier tape 21.

As above, one end of the tape presser 36 is pivotally supported by the feeder bottom support 31 and swingable with respect to the feeder bottom support 31. When situated at the close position where the tape presser 36 is closed with respect to the feeder bottom support 31, the tape presser 36 presses the carrier tape 21 toward the sprocket 34.

Figure 4:
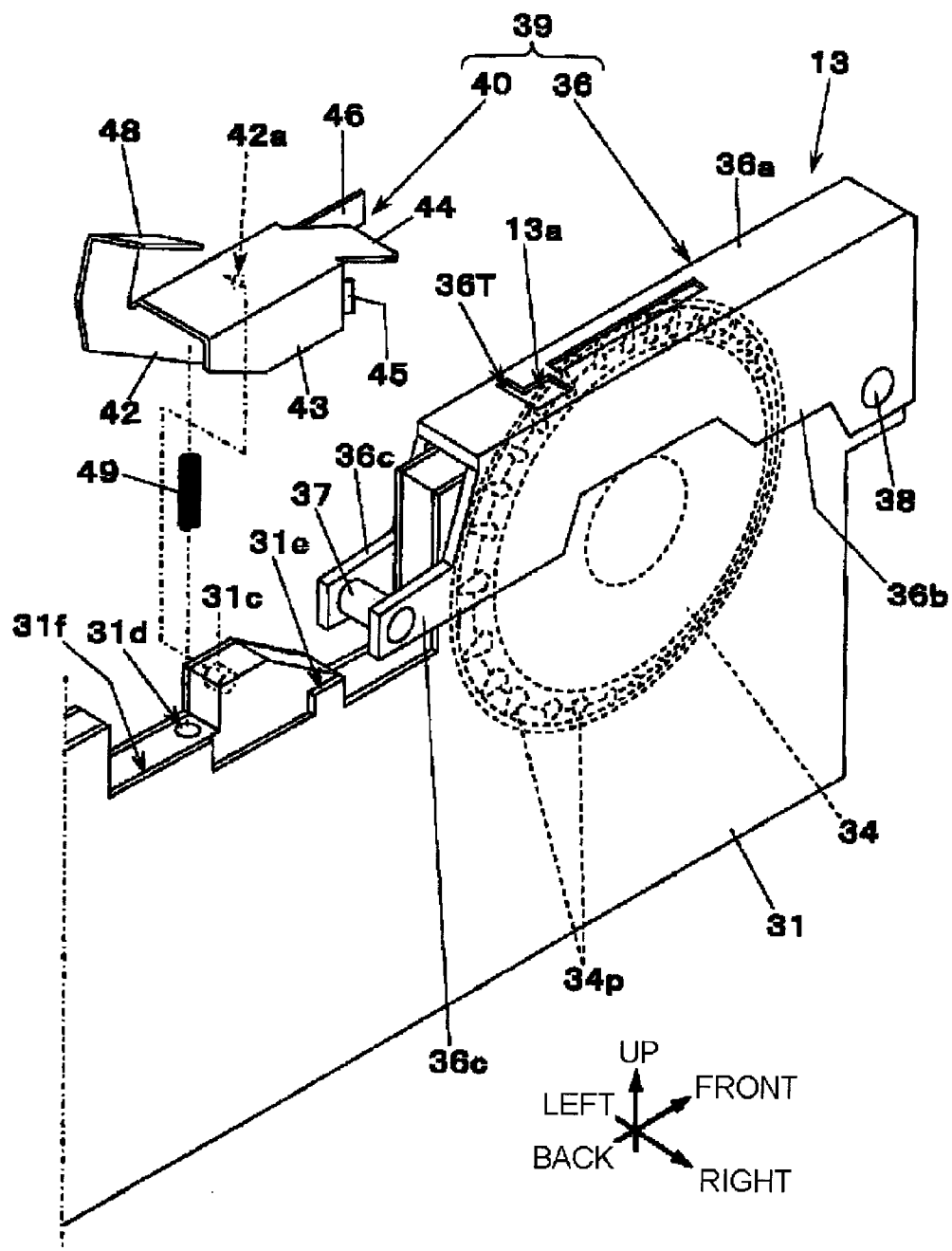
FIG. 4 is a partially enlarged perspective view of the tape feeder of the first embodiment of the present invention.
Figure 5A:
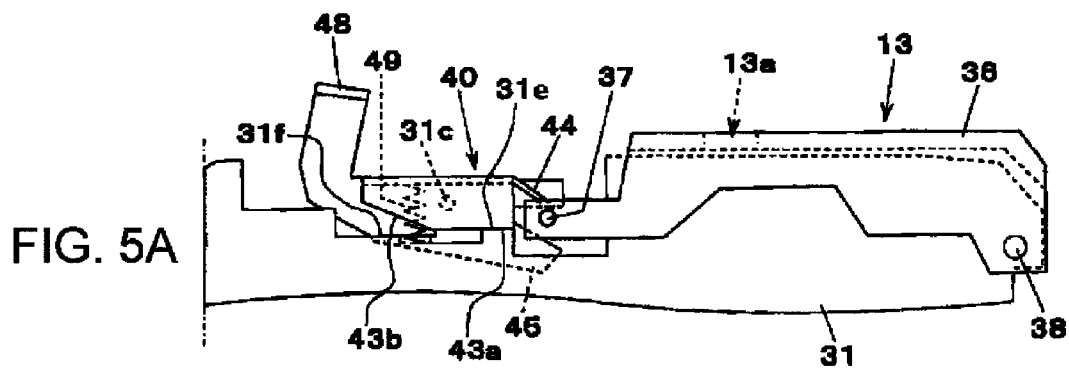
FIGS. 5A, 5B, and 5C are partially side views of the tape feeder of the first embodiment of the present invention.
Figure 6A:
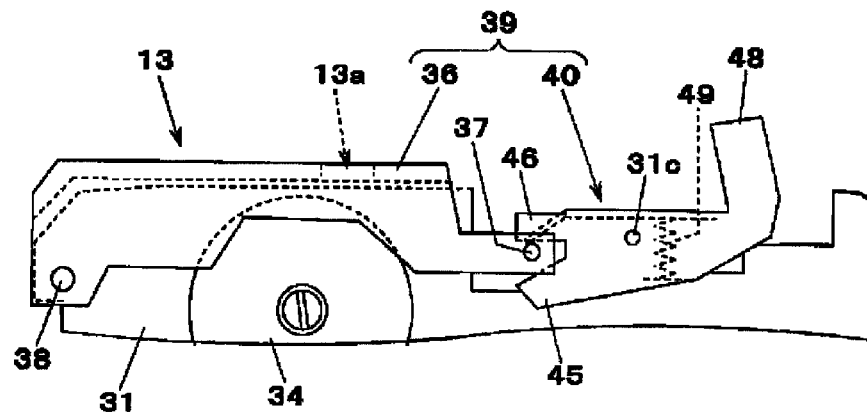
FIGS. 6A, 6B, and 6C are partially side views of the tape feeder of the first embodiment of the present invention.
Figure 7A:
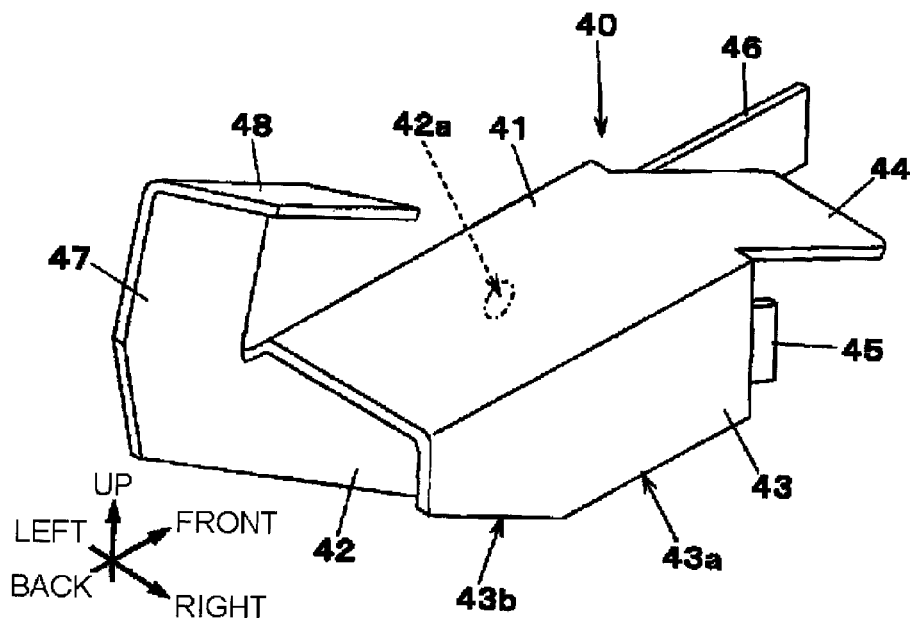
FIGS. 7A and 7B are perspective views of a tape presser operation member provided on the tape feeder of the first embodiment of the present invention.
Figure 7B:
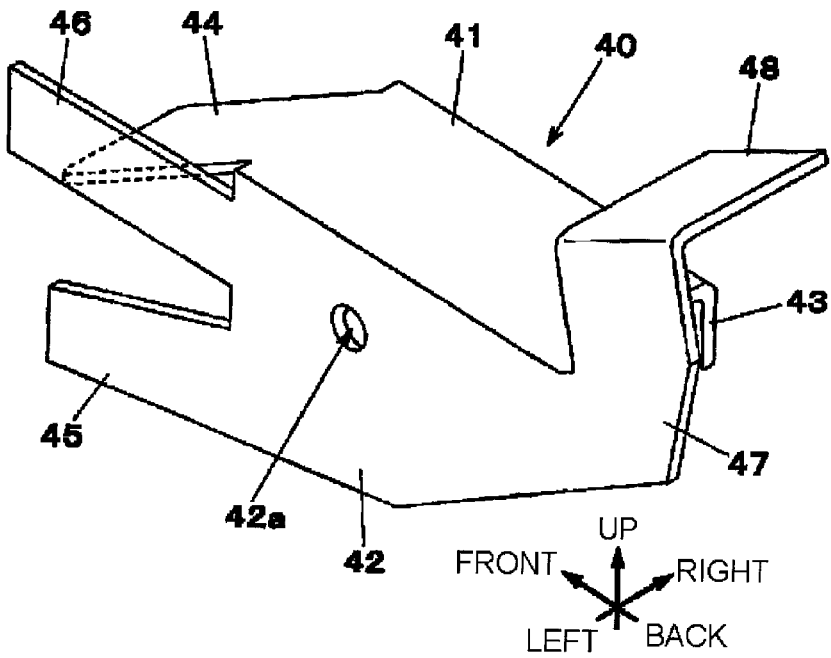

The tape presser 36 is held at the close position by means of a tape presser operation member 40 (FIG. 4) which configures a tape presser mechanism 39 along with the tape presser 36 (FIG. 5A and FIG. 6A). The tape presser operation member 40 is situated behind the tape presser 36 above the feeder bottom support 31. As illustrated in FIG. 7A and FIG. 7B, the tape presser operation member 40 includes an upper surface portion 41 that is extended in the front-back direction of the tape feeder 13 and a pair of side surface portions (a left side surface portion 42 and a right side surface portion 43) that extend downwards from both end faces opposing each other in a lateral direction of the upper surface portion 41. A pivotal projection 31c projecting leftward from the feeder bottom support 31 is fitted into a pivot hole 42a opened in the left side surface portion 42, whereby the entirety of the tape presser operation member 40 is swingable around the pivotal projection 31c.

A press portion 44 which is extended to the front end partly followed by a down-slope is provided at a front end of the upper surface portion 41 of the tape presser operation member 40. A forwardly-extended lift portion 45 is formed in a lower portion of a front end of the left side surface portion 42, and a forwardly-extended regulation portion 46 is formed in an upper portion of the front end of the left side surface portion 42. A rear extension 47 that extends up in a backward direction is formed on a rear end of the left side surface portion 42, and a laterally-extended operation portion 48 is formed at an upper end of the rear extension 47. Incidentally, a lateral dimension of the press portion 44 is smaller than a distance between the pair of rear extensions 36c of the tape presser 36.

In FIG. 4, a biasing spring 49 is inserted in a spring insert aperture 31d located behind the pivotal projection 31c on the feeder bottom support 31. The biasing spring 49 lifts up a rear end side of the tape presser operation member 40. The end portion of the tape presser operation member 40 near the rear end of the tape presser 36 (in other words, a front end portion of the tape presser operation member 40) stays forced downwardly.

As illustrated in FIG. 5A and FIG. 6A, when only the biasing force of the biasing spring 49 acts on the tape presser operation member 40 (when the operation portion 48 is not pushed downwardly), the tape presser operation member 40 brings a front-side surface (hereinafter referred to as a "front contact surface 43a" see also FIG. 7A) of a widely-angled V-shaped undersurface of the right side surface portion 43 into contact, from above, with a front contact 31e (see also FIG. 4) formed on a right side surface of the feeder bottom support 31. Since, in this state, the press portion 44 of the tape presser operation member 40 presses a rear end (the press receiving shaft 37) of the tape presser 36 downwardly, the tape presser 36 is fixedly held in a close position.

Figure 5B:
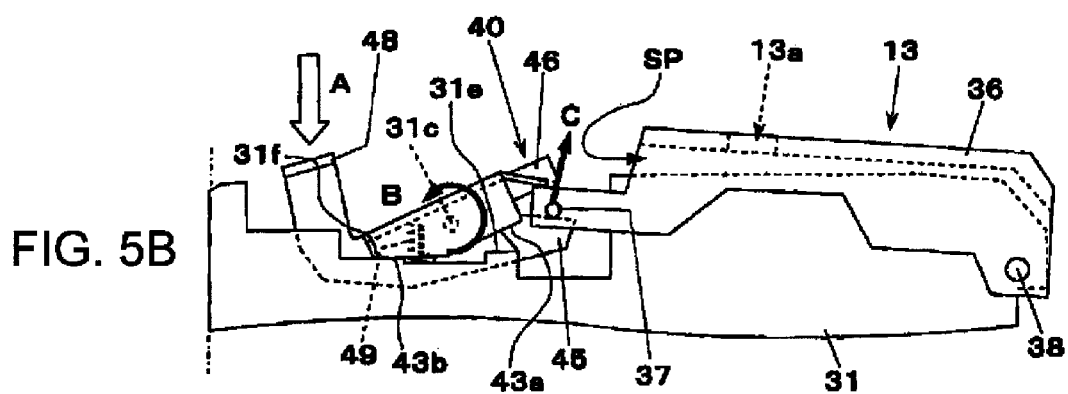
Figure 6B:
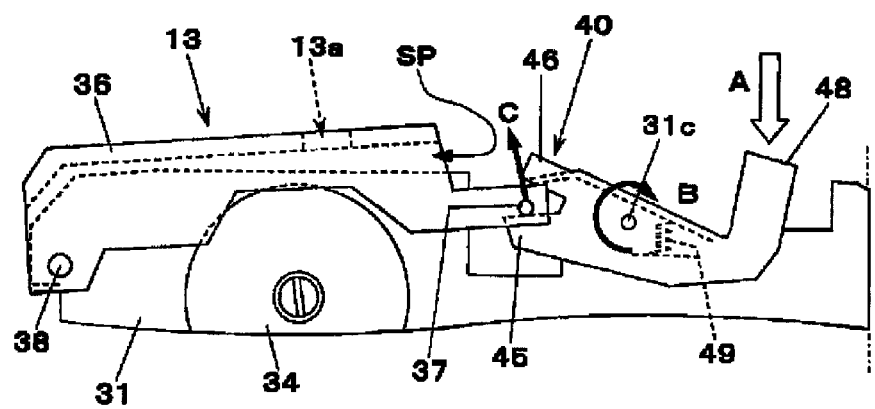

In the meantime, when the operator OP pushes the operation portion 48 downward (as designated by arrow A in the drawing) as illustrated in FIG. 5B and FIG. 6B while the tape presser operation member 40 keeps the front contact surface 43a in contact with the front contact 31e of the feeder bottom support 31, the tape presser operation member 40 swings around the pivotal projection 31c against the biasing force of the biasing spring 49 (as designated by arrow B in the drawing), thereupon bringing a rear surface (hereinafter referred to as a "rear contact surface 43b," and see also FIG. 7A) of the V-shaped undersurface formed in the lower portion of the right side surface portion 43 into contact, from above, with a rear contact 31f (see also FIG. 4) formed on the right side surface of the feeder bottom support 31. From when the operator OP pushes the operation portion 48 downwards until the rear contact surface 43b comes into contact with the rear contact 31f of the feeder bottom support 31, the tape presser operation member 40 lifts up the rear end (the press receiving shaft 37) of the tape presser 36 by means of the lift portion 45 (as designated by arrow C in FIG. 5B and FIG. 6B), thereby releasing the rear end of the tape presser 36 from the pressure and making the tape presser 36 slightly open up from the close position on the feeder bottom support 31. With the tape presser 36 slightly open up from the close position as mentioned above, a tape insertion space SP whose vertical dimension is suffice for insertion of the carrier tape 21 and enabling the sprocket holes 21*b* of the carrier tape 21 to engage with the feed pins 34*p* of the sprocket 34 is formed between the tape presser 36 and the feeder bottom support 31.

As mentioned above, in the first embodiment, the tape presser operation member 40 is swingably attached to the feeder bottom support 31 and swings between two positions. Namely, at one position (illustrated in FIG. 5A and FIG. 6A and hereinafter referred to as a "fixed position"), the tape presser operation member 40 pushes a rear end of the tape presser 36 (the other end of the tape presser 36 on condition that an end of the tape presser 36 pivotally supported by the pivotal shaft 38 is taken as one end) toward the feeder bottom support 31 (in the downward direction) and fixedly holds the tape presser 36 in the close position. At another position (illustrated in FIG. 5B and FIG. 6B and hereinafter referred to an "unfixed position"), the tape presser operation member 40 releases the rear end of the tape presser 36 from the pressure. Swung to the unfixed position from the fixed position where the tape presser operation member 40 holds the rear end of the tape presser 36 pressed, the tape presser operation member 40 lifts up the rear end of the tape presser 36 from below to thus form the tape insertion space SP that enables insertion of the carrier tape 21 between the tape presser 36 and the feeder bottom support 31.

In detail, the tape presser operation member 40 is attached to the feeder bottom support 31 in a swingable manner, and an end (namely, a front end) of the tape presser operation member 40 close to the rear end of the tape presser 36 is forced downwards by means of the biasing spring 49 that is provided between the tape presser operation member 40 and the feeder bottom support 31 and that works as a biasing member. The end (the front end) of the tape presser operation member 40 is equipped with the press portion 44 that presses the rear end of the tape presser 36 and the lift portion 45 that lifts up the rear end of the tape presser 36.

Figure 5C:
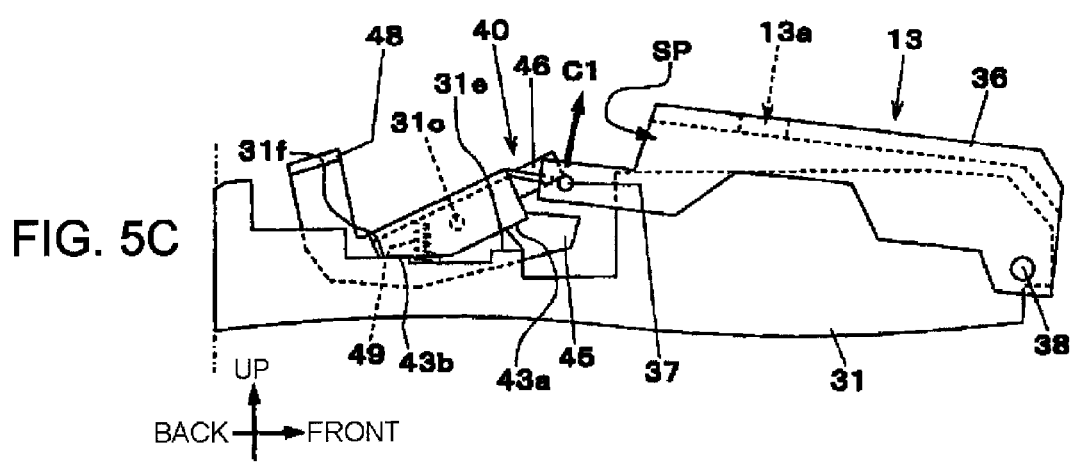
Figure 6C:
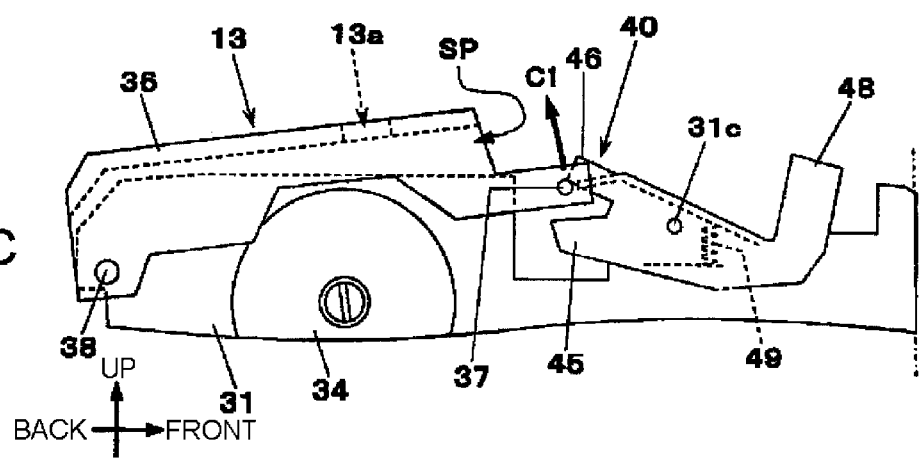

As above, when the tape presser operation member 40 is placed at the unfixed position, the tape insertion space SP is formed between the tape presser 36 and the feeder bottom support 31. The tape presser 36 can further move from this position in a direction of open with respect to the feeder bottom support 31 (as designated by arrow C1 illustrated in FIG. 5C and FIG. 6C). The movement of the tape presser 36 is possible until the press receiving shaft 37 comes into contact, from below, with the regulation portion 46 provided on the tape presser operation member 40. The movement of the tape presser 36 enables enlargement of the tape insertion space SP.

In FIG. 2 and FIG. 3, a top tape 21*t* is laid over a front face (upper surface) of the carrier tape 21 in order to prevent the components 4 from falling from the respective component storages 21*a*. After being peeled before the component storage 21*a* arrives at the component feed port 13*a*, the top tape 21*t* is drawn backwards from atop tape pullout port 36T (see also FIG. 4) (as designated by arrow D illustrated in FIG. 2 and FIG. 3) and recovered by a top tape recovery mechanism 50 disposed behind the feeder bottom support 31.

As mentioned previously, the carrier tape 21 travels over the tape passage 32 of the feeder bottom support 31 by being pulled by the sprocket 34. However, before the carrier tape 21 passes by a position below the component feed port 13*a* of the tape presser 36, the top tape 21*t* is peeled off from the top face of the carrier tape 21, so that the component 4 stored in each of the component storages 21*a* can be picked upward at the component feed port 13*a*.

Figure 8:
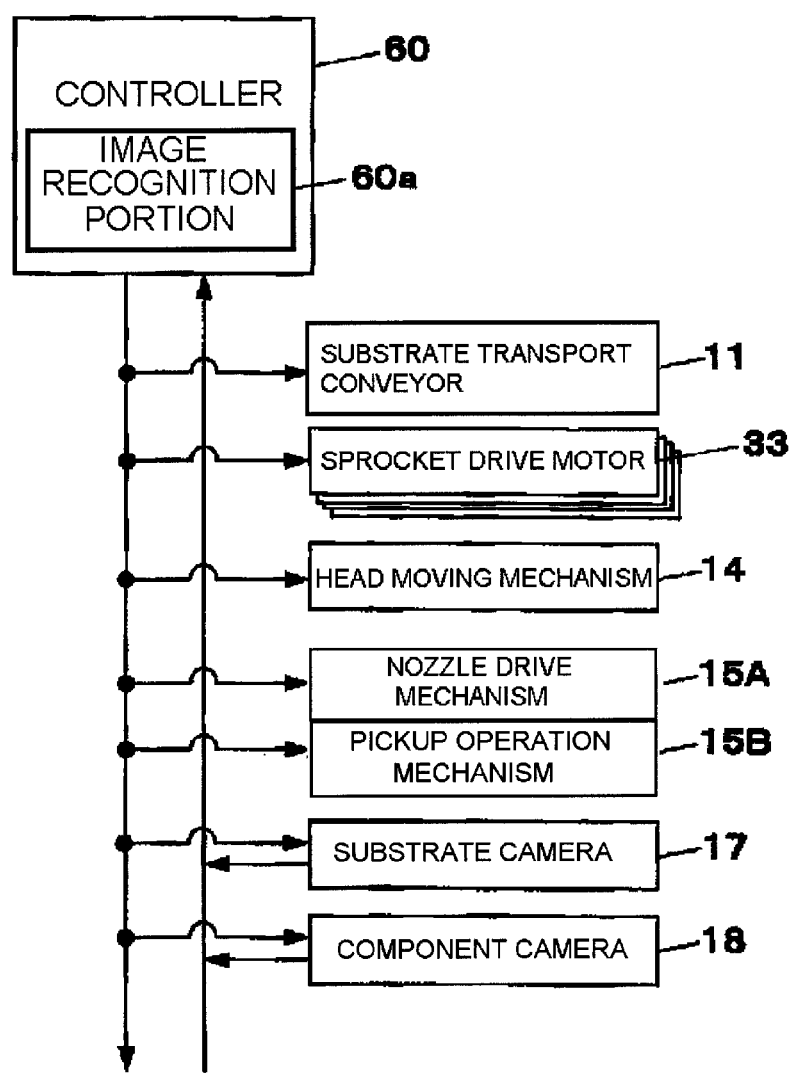
FIG. 8 is a block diagram illustrating a control system of the component mounting apparatus of the first embodiment of the present invention.

In FIG. 8, a controller 60 provided in the component mounting apparatus 1 controls operation of the substrate transport conveyor 11, whereby conveyance and positioning of the substrate 2 are carried out. The controller 60 lets the sprocket drive motor 33, which is provided for each of the tape feeders 13, rotate the corresponding sprocket 34, thereby performing operation of feeding the carrier tape 21 of the tape feeder 13 (operation of feeding the components 4 to the component feed port 13*a*). Incidentally, the respective tape feeders 13 are attached to the feeder base 12, to thus be electrically connected to the controller 60. Thus, the controller 60 can control operation of the sprocket drive motors 33, and others.

The controller 60 controls operation of the head moving mechanism 14 (movement of the X-axis table 14*b* with respect to the Y-axis table 14*a* and movement of the moving stage 14*c* with respect to the X-axis table 14*b*), whereby the mount head 15 is moved within a horizontal plane (FIG. 8). The controller 60 controls operation of a nozzle drive mechanism 15A (FIG. 8) provided in the mount head 15, whereby vertical movements of the respective pickup nozzles 16 with respect to the mount head 15 and rotations of the respective pickup nozzles 16 around the vertical axis are performed. Further, the controller 60 controls operation of a pickup operation mechanism 15B (FIG. 8), whereby the respective pickup nozzles 16 pick up and release the components 4.

In FIG. 8, the controller 60 controls imaging operation of the substrate camera 17 and imaging operation of the component camera 18. Image data obtained by imaging operation of the substrate camera 17 and image data obtained by imaging operation of the component camera 18 are respectively input to the controller 60, and an image recognition portion 60*a* provided in the controller 60 subjects the data to image recognition processing.

Figure 9:
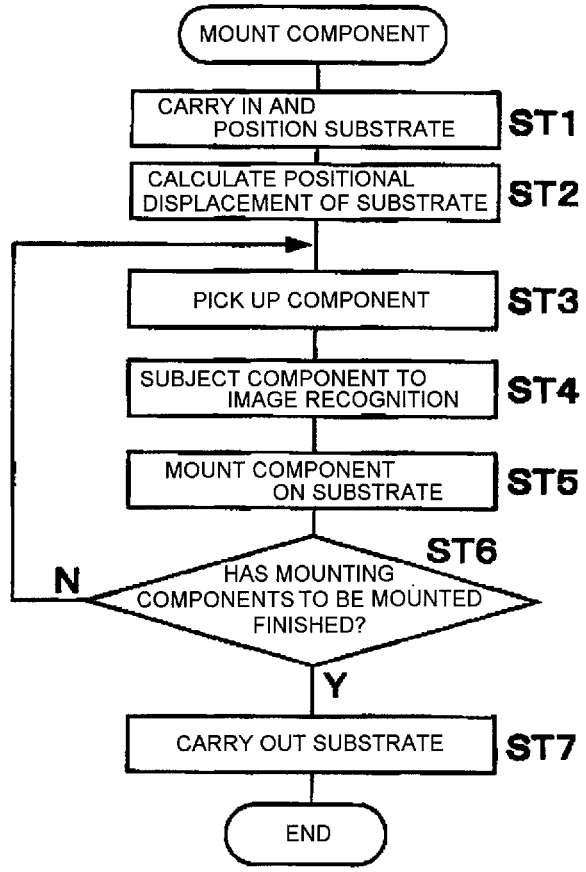
FIG. 9 is a flowchart illustrating procedures by which the component mounting apparatus of the first embodiment of the present invention performs component mounting operation.

By reference to a flowchart shown in FIG. 9, explanations are now given to procedures by which the component mounting apparatus 1 having the above configuration performs component mount operation for mounting the components 4 to the respective electrodes 3 on the substrate 2. In the component mount operation, the controller 60 first activates the substrate transport conveyor 11 to thus receive the substrate 2 delivered from an apparatus that is located upstream with reference to the component mounting apparatus 1, to carry the thus-received substrate 2 into the component mounting apparatus 1, and to position the substrate 2 at a predetermined work position (step ST1).

After finishing carry-in and positioning of the substrate 2, the controller 60 moves the mount head 15, to thus move the substrate camera 17 to an elevated location above the substrate 2 and let the substrate camera 17 capture an image of a pair of substrate marks 2*m* (FIG. 1) on the substrate 2, and the image recognition section 60*a* subjects the image data to image recognition. The thus-acquired positions of the pair of substrate marks 2*m* are compared with preset reference positions, thereby calculating positional displacements of the substrate 2 from the reference positions (step ST2).

After calculating the positional displacements of the substrate 2 from the reference positions, the controller 60 positions the mount head 15 to an elevated location above the tape feeder 13 while controlling operation of the tape feeder 13 and feeding the components 4 to the component feed port 13*a* of the tape feeder 13, and subsequently lets the mount head 15 pick up the components 4 fed to the component feed port 13a of the tape feeder 13 (step ST3).

After the components 4 are picked up by the pickup nozzles 16, the controller 60 moves the mount head 15 such that the components 4 pass by an elevated location above the component camera 18, letting the component camera 18 capture an image of the components 4 and the image recognition section 60a perform image recognition (step ST4). On occasion of image recognition, the controller 60 calculates positional displacements (pickup displacements) of the components 4 from the pickup nozzles 16.

After performing image recognition of the components 4, the controller 60 lets the mount head 15 stay at an elevated location above the substrate 2 and lets the pickup nozzles 16 release the components 4 after bringing the components 4 picked up by the pickup nozzles 16 into contact with the respective electrodes 3 on the substrate 2, thereby attaching the components 4 to the substrate 2 (step ST5). In a component attachment step, the controller 60 makes a positional correction (including a rotational correction) to the positions of the pickup nozzles 16 with respect to the substrate 2 such that the positional displacement of the substrate 2 determined in step ST2 and the positional displacements of the components 4 determined in step ST4 are corrected.

After attaching the components 4 to the substrate 2, the controller 60 determines whether all of the components 4 to be attached to the substrate 2 have finished being attached (step ST6). When not all the components 4 to be attached to the substrate 2 have not finished being attached, processing returns to step ST3, where the pickup nozzles 16 pick up the next component 4. On the contrary, when all of the components 4 to be attached to the substrate 2 have finished being attached, the substrate transport conveyor 11 is activated, to thus carry the substrate 2 out of the component mounting apparatus 1 (step ST7), and completes the component mount operation for one substrate 2.

The component mounting apparatus 1 performs component mount operation along the procedures, such as those mentioned above. However, at the commencement of production or when the carrier tape 21 being fed by the tape feeder 13 has run short of components, the operator OP performs operation of newly attaching the carrier tape 21 to the tape feeder 13. When newly attaching the carrier tape 21 to the tape feeder 13, the operator OP first pulls the carrier tape 21 from the reel 22 held on the reel holder 35 by a given amount, subsequently fitting a part of the thus-pulled carrier tape 21 into the tape passage 32 from the lateral direction (the right side) of the feeder bottom support 31.

Figure 10A:
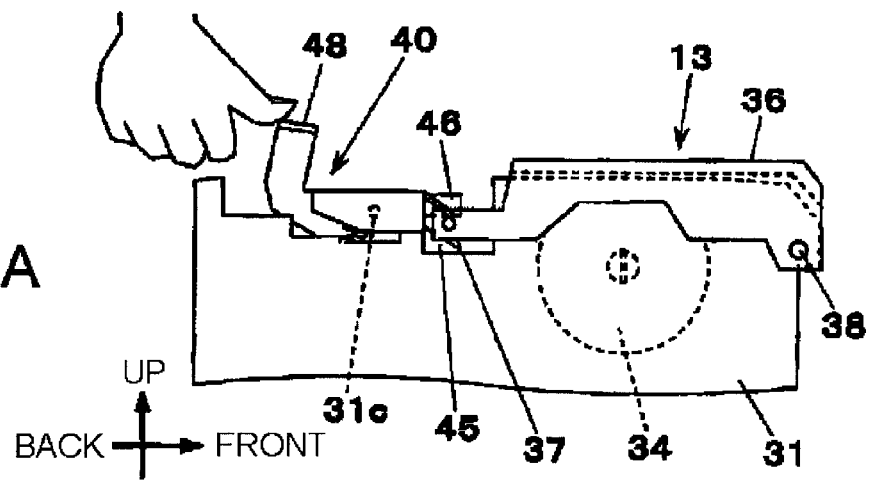
FIGS. 10A, 10B, and 10C are drawings for explaining procedures of attaching a carrier tape to the tape feeder of the first embodiment of the present invention.
Figure 10B:
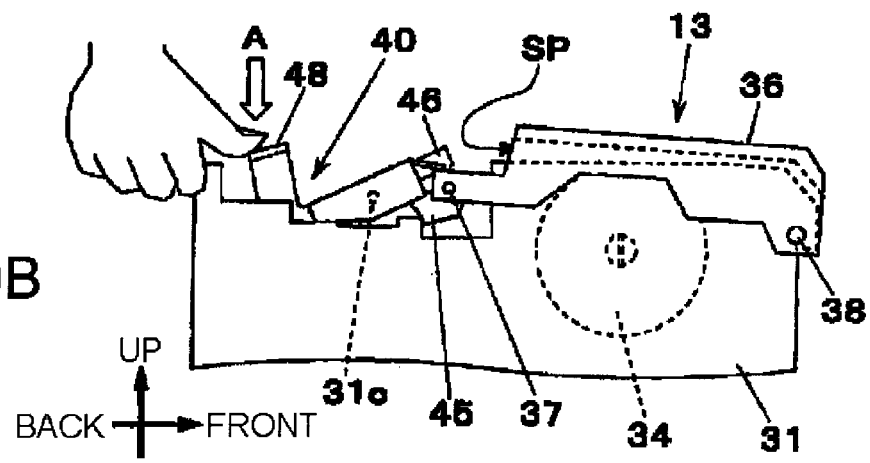
Figure 10C:
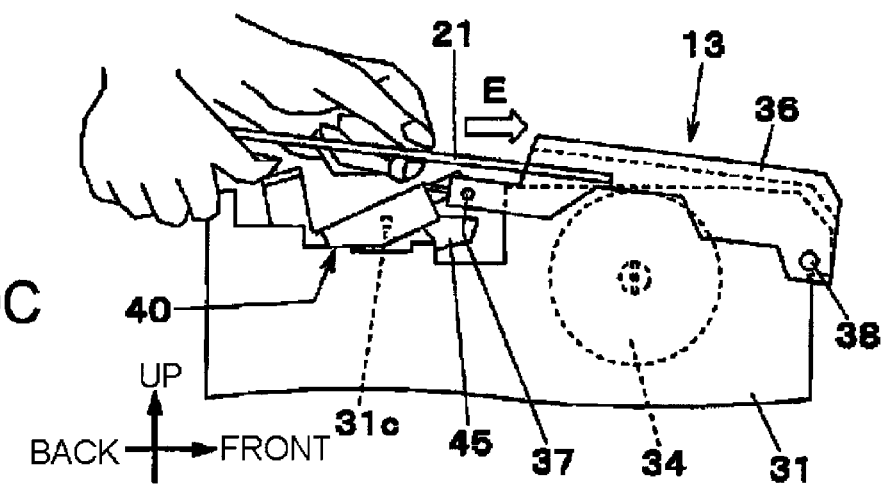

After fitting the part of the carrier tape 21 into the tape passage 32 in this way, the operator OP pushes the operation portion 48 located on the rear end of the tape presser 36 downwardly (FIG. 10A to FIG. 10B, as designated by arrow A illustrated in FIG. 10B), thereby forming the tape insertion space SP between the tape presser 36 and the feeder bottom support 31. While the operation portion 48 is continuously kept pressed, a head of the carrier tape 21 which is about to be attached is inserted into the tape insertion space SP from the back of the tape presser 36 (as designated by arrow E illustrated in FIG. 10O), to thus bring the sprocket holes 21b of the carrier tape 21 into engagement with the feed pins 34p situated at the upper end of the sprocket 34 (engagement operation). At this time, the tape presser 36 is pushed in a direction opening with respect to the feeder bottom support 31 before the press receiving shaft 37 comes into contact, from below, with the regulation portion 46 of the tape presser operation member 40. Hence, the tape insertion space SP is broadened, so that insertion of the carrier tape 21 into the tape insert hole SP becomes easy.

When the tape insertion space SP is formed between the feeder bottom support 31 and the tape presser 36 by means of the tape presser 36 being lifted up by the tape presser operation member 40 as mentioned above, the carrier tape 21 is pressed by the tape presser 36 and a curl is straightened, so that the operator OP can readily perform engagement operation.

After bringing the sprocket holes 21b of the carrier tape 21 into engagement with the feed pins 34p of the sprocket 34 as mentioned above, the operator OP releases his/her hand from the operation portion 48 of the tape presser operation member 40. The tape presser operation member 40 thereby returns to the fixed position under the biasing force of the biasing spring 49, so that the tape presser 36 is released from the lifted state. Thereupon, the tape presser 36 comes to the close position, so that the carrier tape 21 is securely pressed toward the sprocket 34. When the tape presser 36 comes to the close position, the operator OP draws into the top tape recovery mechanism 50 the top tape 21t pulled out of the top tape pullout port 36T. Attaching the carrier tape 21 to the tape feeder 13 is thereby completed.

As above, when the tape presser operation member 40 is swung from the fixed position to the unfixed position, the tape insertion space SP that enables insertion of the carrier tape 21 between the tape presser 36 and the feeder bottom support 31 is formed. The carrier tape 21 inserted from the tape insertion space SP is pressed by the tape presser 36, thereby straightening its curl. Accordingly, operation for bringing the carrier tape 21 into engagement with the sprocket 34 is easy to perform. After performance of engagement operation, the carrier tape 21 will not come out of engagement with the sprocket 34 before the tape presser 36 is brought into the close position. Hence, operation of attaching the carrier tape 21 can be readily performed.

As described above, in the tape feeder 13 of the first embodiment, the tape presser mechanism 39 that presses the carrier tape 21 toward the feeder bottom support 31 is configured of the tape presser 36 that is at one end pivotally supported by the feeder bottom support 31 and swingable with respect to the feeder bottom support 31 and that presses the carrier tape 21 toward the sprocket 34 while positioned at the close position where the tape feeder 36 is closed with respect to the feeder bottom support 31. The tape presser mechanism 39 is further configured of the tape presser operation member 40 that is swingably attached to the feeder bottom support 31 and that swings between the fixed position where the tape presser 36 is fixed to the close position with its other end pressed toward the feeder bottom support 31 and the unfixed position where the other end of the tape feeder 36 is released from the pressure. The tape presser 36 and the tape presser operation member 40 for actuating the tape presser 36 are configured separately from each other. Consequently, force required to operate the tape presser 36 in a direction of opening with respect to the feeder bottom support 31 can be diminished, and operation for bringing the carrier tape 21 into engagement with the sprocket 34 is facilitated, thereby enabling enhancement of workability.

Second Embodiment

A second embodiment of the present invention is now described. A tape feeder (assigned reference numeral 113) of the second embodiment differs in shape from the tape presser operation member that configures the tape feeder 13 and the tape presser mechanism 39 described in the first embodiment. A tape presser operation member of the tape feeder 113 of the second embodiment is assigned reference numeral 140, and portions of the tape presser operation member that are identical in configuration with their counterparts described in the first embodiment are assigned the same reference numerals, and their repeated explanations are omitted.

Figure 11:
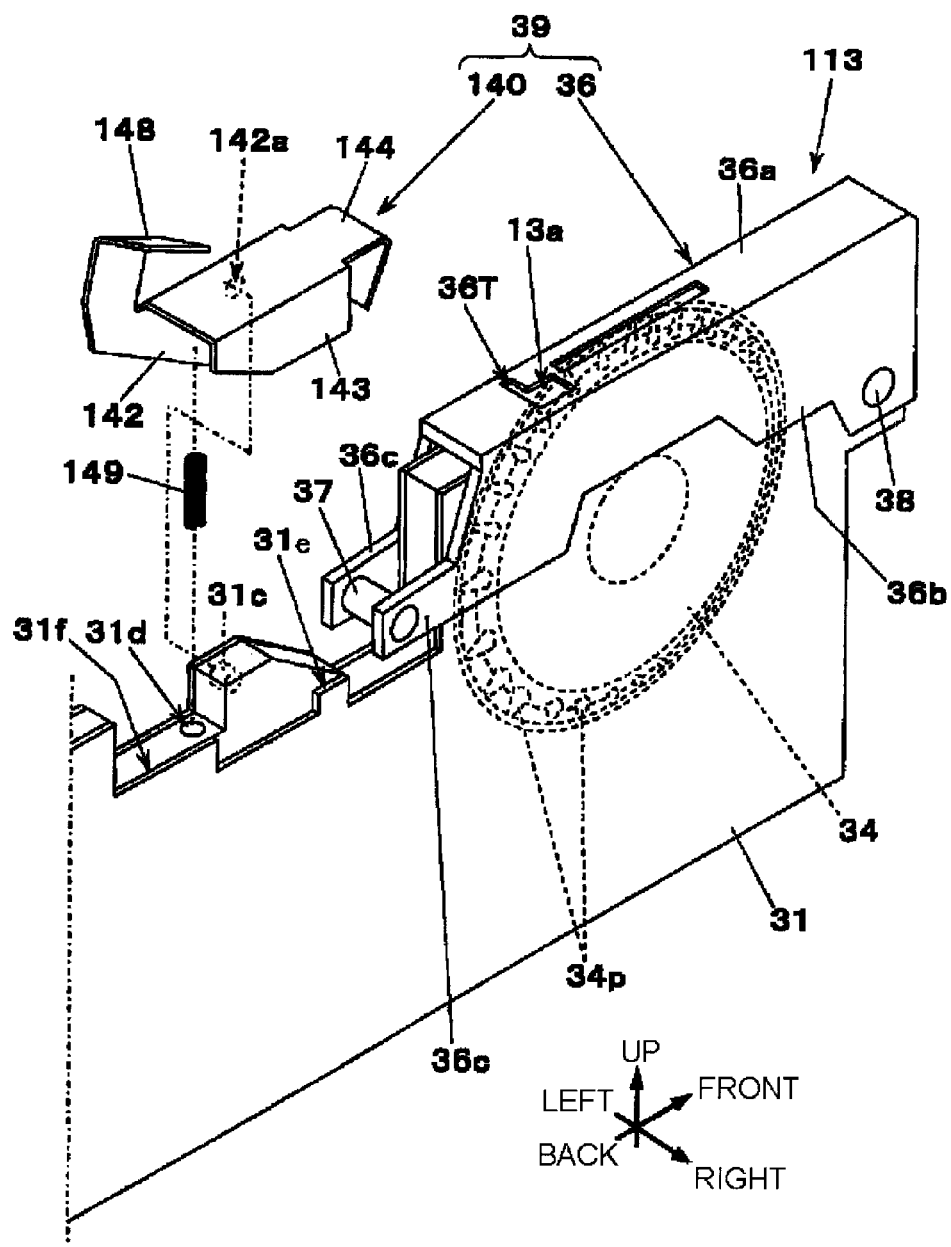
FIG. 11 is a partially enlarged perspective view of a tape feeder of a second embodiment of the present invention.
Figure 12A:
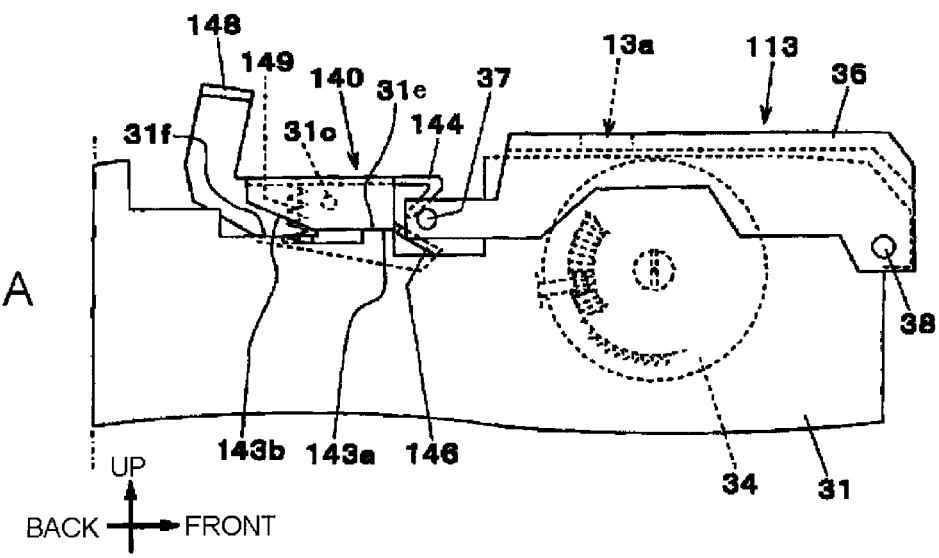
FIGS. 12A and 12B are partially side views of the tape feeder of the second embodiment of the present invention.
Figure 14A:
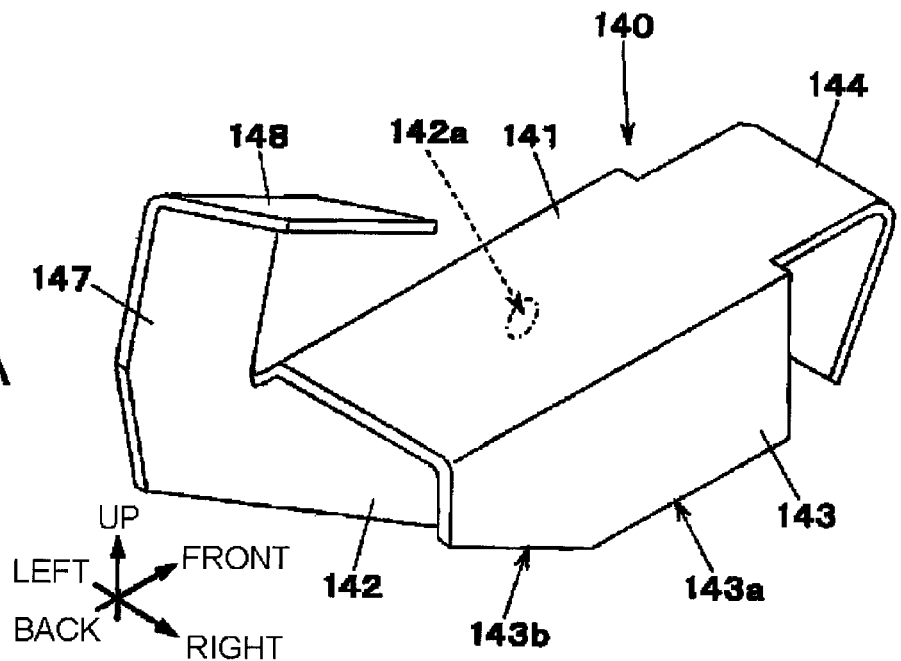
FIGS. 14A and 14B are perspective views of a tape presser operation member provided on the tape feeder of the second embodiment of the present invention.
Figure 14B:
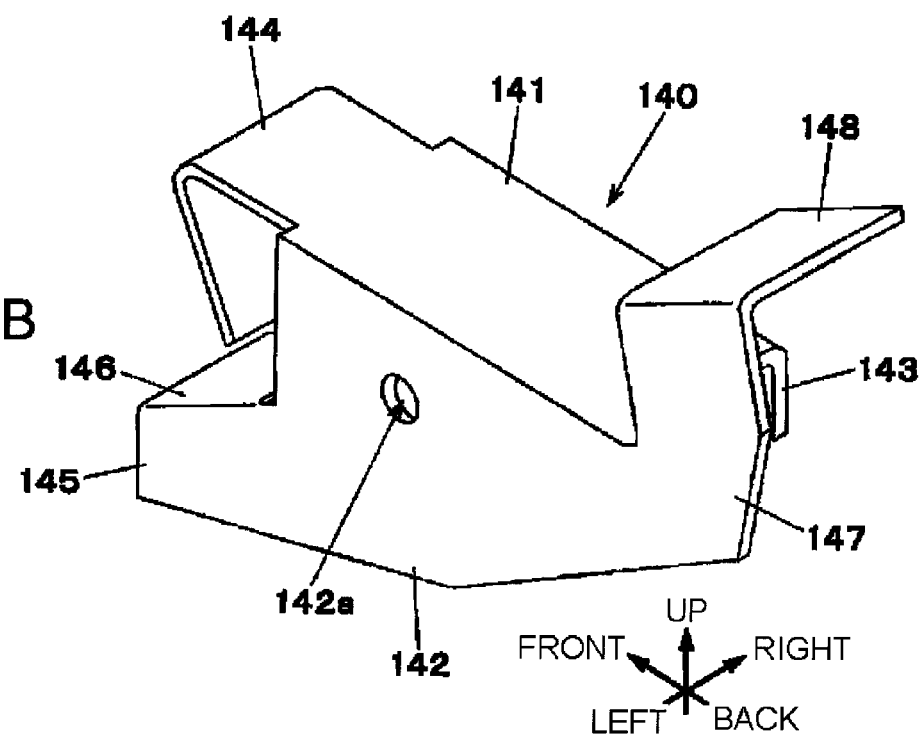

In the tape feeder 113 described in connection with the second embodiment, the tape presser 36 is held at the close position by the tape presser operation member 140 (FIG. 11) (FIG. 12A and FIG. 13A). As illustrated in FIG. 14A and FIG. 14B, the tape presser operation member 140 includes an upper surface portion 141 that is extended in a front-back direction of the tape feeder 113 and a pair of side surface portions (a left side surface portion 142 and a right side surface portion 143) that extend downwards from both end faces opposing each other in a lateral direction of the upper surface portion 141. The pivotal projection 31c projecting leftward from the feeder bottom support 31 is fitted into a pivot hole 142a opened in the left side surface portion 142, whereby the entirety of the tape presser operation member 140 is swingable around the pivotal projection 31c.

A press portion 144 which is extended to the front and partly followed by a down-slope is provided at a front end of the upper surface portion 141 of the tape presser operation member 140. A forwardly extension 145 is formed on a front end of the left side surface portion 142, and a laterally-extended lift portion 146 is formed in an upper portion of the front end of the forwardly extension 145. A rear extension 147 that extends up in a backward direction is formed on a rear end of the left side surface portion 142, and a laterally-extended operation portion 148 is formed at an upper end of the rear extension 147. Incidentally, a lateral dimension of the press portion 144 is smaller than a distance between the pair of rear extensions 36c of the tape presser 36.

In FIG. 11, a biasing spring 149 is inserted in the spring insert aperture 31d located behind the pivotal projection 31c on the feeder bottom support 31. The biasing spring 149 lifts up a rear end side of the tape presser operation member 140. The end portion of the tape presser operation member 140 near the rear end of the tape presser 36 (in other words, a front end portion of the tape presser operation member 140) stays forced downwardly.

As illustrated in FIG. 12A and FIG. 13A, when only the biasing force of the biasing spring 149 acts on the tape presser operation member 140 (when the operation portion 148 is not pushed downwardly), the tape presser operation member 140 brings a front-side surface (hereinafter referred to as a "front contact surface 143a" see also FIG. 14A) of a widely-angled V-shaped undersurface of the right side surface portion 143 into contact, from above, with the front contact 31e (see also FIG. 11) formed on the right side surface of the feeder bottom support 31. Since, in this state, the press portion 144 of the tape presser operation member 140 presses the rear end (the press receiving shaft 37) of the tape presser 36 downwardly, the tape presser 36 is fixedly held in a close position.

Figure 12B:
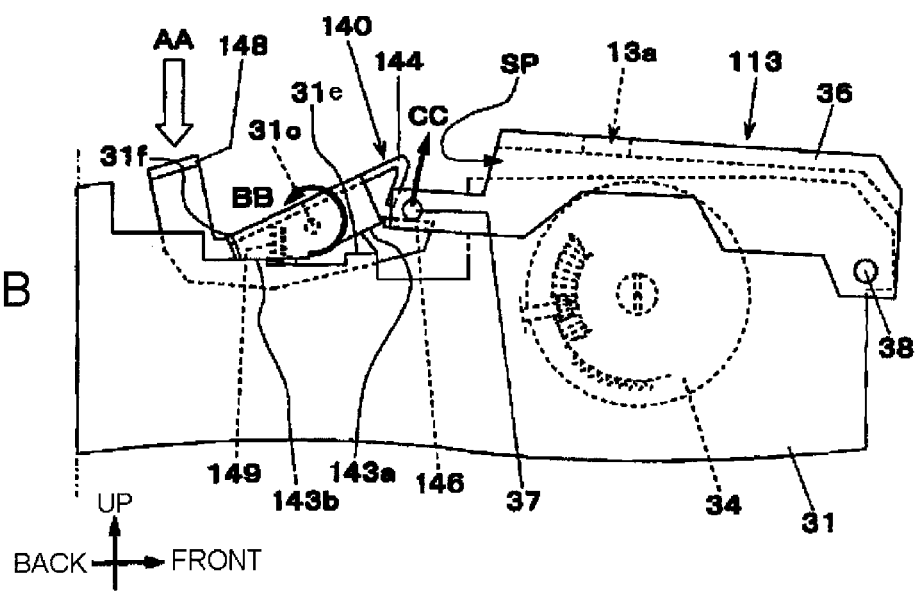

In the meantime, when the operator OP pushes the operation portion 148 downward (as designated by arrow AA in the drawing) as illustrated in FIG. 12B and FIG. 13B while the tape presser operation member 140 holds the front contact surface 143a in contact with the front contact 31e of the feeder bottom support 31, the tape presser operation member 140 turns around the pivotal projection 31c against the biasing force of the biasing spring 149 (as designated by arrow BB in the drawing), thereupon bringing a rear surface (hereinafter referred to as a "rear contact surface 143b," and see also FIG. 14A) of the V-shaped undersurface formed in the lower portion of the right side surface portion 143 into contact, from above, with the rear contact 31f (see also FIG. 11) formed on the right side surface of the feeder bottom support 31. From when the operator OP pushes the operation portion 148 downwards until the rear contact surface 143b comes into contact with the rear contact 31f of the feeder bottom support 31, the tape presser operation member 140 lifts up the rear end (the press receiving shaft 37) of the tape presser 36 by means of the lift portion 146 (as designated by arrow CC in the drawing), thereby releasing the rear end of the tape presser 36 from the pressure and making the tape presser 36 slightly open up from the close position on the feeder bottom support 31. With the tape presser 36 slightly open up from the close position as mentioned above, the tape insertion space SP whose vertical dimension is suffice for insertion of the carrier tape 21 and enabling the sprocket holes 21b of the carrier tape 21 to engage with the feed pins 34p of the sprocket 34 is formed between the tape presser 36 and the feeder bottom support 31.

As mentioned above, in the second embodiment, the tape presser operation member 140 is swingably attached to the feeder bottom support 31 and swings between two positions. Namely, at one position (illustrated in FIG. 12A and FIG. 13A and hereinafter referred to as a "fixed position"), the tape presser operation member 140 pushes the rear end of the tape presser 36 (the other end of the tape presser 36 on condition that an end of the tape presser 36 pivotally supported by the pivotal shaft 38 is taken as one end) toward the feeder bottom support 31 (in the downward direction) and fixedly holds the tape presser 36 in the close position. At another position (illustrated in FIG. 12B and FIG. 13B and hereinafter referred to an "unfixed position"), the tape presser operation member 140 releases the rear end of the tape presser 36 from the pressure. Swung to the unfixed position from the fixed position where the tape presser operation member 140 holds the rear end of the tape presser 36 pressed, the tape presser operation member 140 lifts up the rear end of the tape presser 36 from below to thus form the tape insertion space SP that enables insertion of the carrier tape 21 between the tape presser 36 and the feeder bottom support 31.

In detail, the tape presser operation member 140 is swingably attached to the feeder bottom support 31, and an end (namely, a front end) of the tape presser operation member 140 near the rear end of the tape presser 36 is forced downwards by means of the biasing spring 149 that is provided between the tape presser member operation member 140 and the feeder bottom support 31 and that works as a biasing member. The end (the front end) of the tape presser operation member 140 is equipped with the press portion 144 that presses the rear end of the tape presser 36 and the lift portion 146 that lifts up the rear end of the tape presser 36.

During the component mount operation performed by the component mounting apparatus 1, when newly attaching the carrier tape 21 to the tape feeder 113, the operator OP first pulls the carrier tape 21 from the reel 22 held on the reel holder 35 by a given amount, subsequently fitting a part of the thus-pulled carrier tape 21 into the tape passage 32 from the lateral direction (the right side) of the feeder bottom support 31.

Figure 15A:
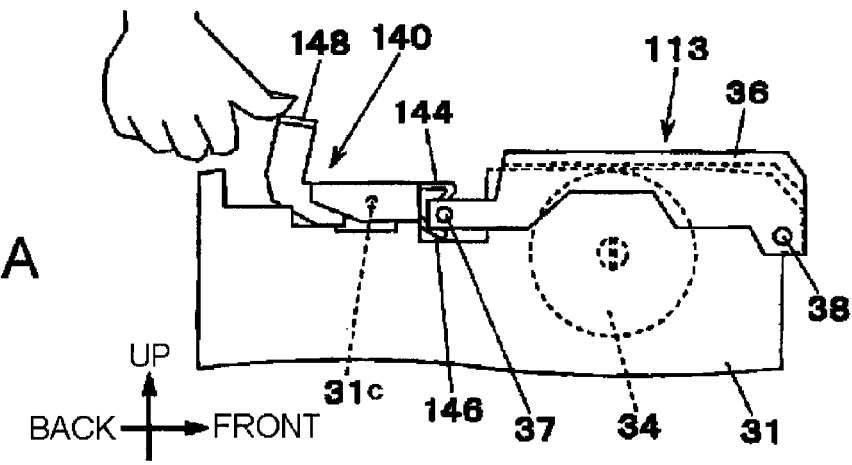
FIGS. 15A, 15B, and 15C are drawings for explaining procedures of attaching a carrier tape to the tape feeder of the second embodiment of the present invention.
Figure 15B:
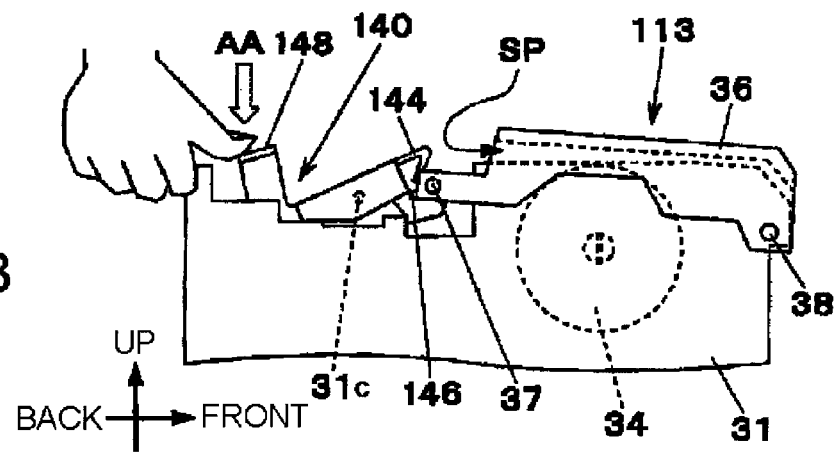
Figure 15C:
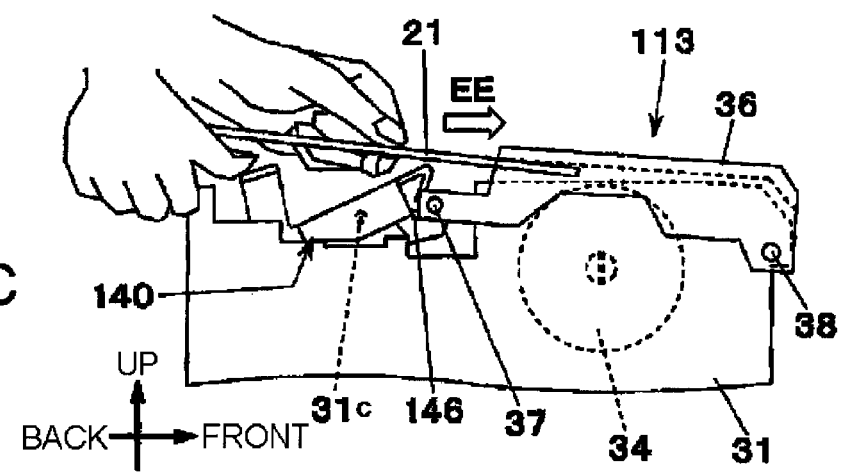

After fitting the part of the carrier tape 21 into the tape passage 32 in this way, the operator OP pushes the operation portion 148 located on the rear end of the tape presser 36 downwardly (FIG. 15A to FIG. 15B, as designated by arrow AA illustrated in FIG. 15B), thereby forming the tape insertion space SP between the tape presser 36 and the feeder bottom support 31. While the operation portion 148 is continuously kept pressed, ahead of the carrier tape 21 which is about to be attached is inserted into the tape insertion space SP from the back of the tape presser 36 (as designated by arrow EE illustrated in FIG. 15C), to thus bring the sprocket holes 21b of the carrier tape 21 into engagement with the feed pins 34p situated at the upper end of the sprocket 34 (engagement operation). When the tape insertion space SP is formed between the feeder bottom support 31 and the tape presser 36 by means of the tape presser 36 being lifted up by the tape presser operation member 140 as mentioned above, the carrier tape 21 is pressed by the tape presser 36 and a curl is straightened, so that the operator OP can readily perform engagement operation.

After bringing the sprocket holes 21b of the carrier tape 21 into engagement with the feed pins 34p of the sprocket 34 as mentioned above, the operator OP releases his/her hand from the operation portion 148 of the tape presser operation member 140. The tape presser operation member 140 thereby returns to the fixed position under the biasing force of the biasing spring 149, so that the tape presser 36 is released from the lifted state. Thereupon, the tape presser 36 comes to the close position, so that the carrier tape 21 is securely pressed toward the sprocket 34. As is the case with the first embodiment, when the tape presser 36 comes to the close position, the operator OP draws into the top tape recovery mechanism 50 the top tape 21t pulled out of the top tape pullout port 36T.

As above, when the tape presser operation member 140 is swung from the fixed position to the unfixed position, the tape insertion space SP that enables insertion of the carrier tape 21 between the tape presser 36 and the feeder bottom support 31 is formed. The carrier tape 21 inserted from the tape insertion space SP is pressed by the tape presser 36, thereby straightening its curl. Accordingly, operation for bringing the carrier tape 21 into engagement with the sprocket 34 is easy to perform. After performance of engagement operation, the carrier tape 21 will not come out of engagement with the sprocket 34 before the tape presser 36 is brought into the close position. Hence, operation of attaching the carrier tape 21 can be readily performed.

Figure 16A:
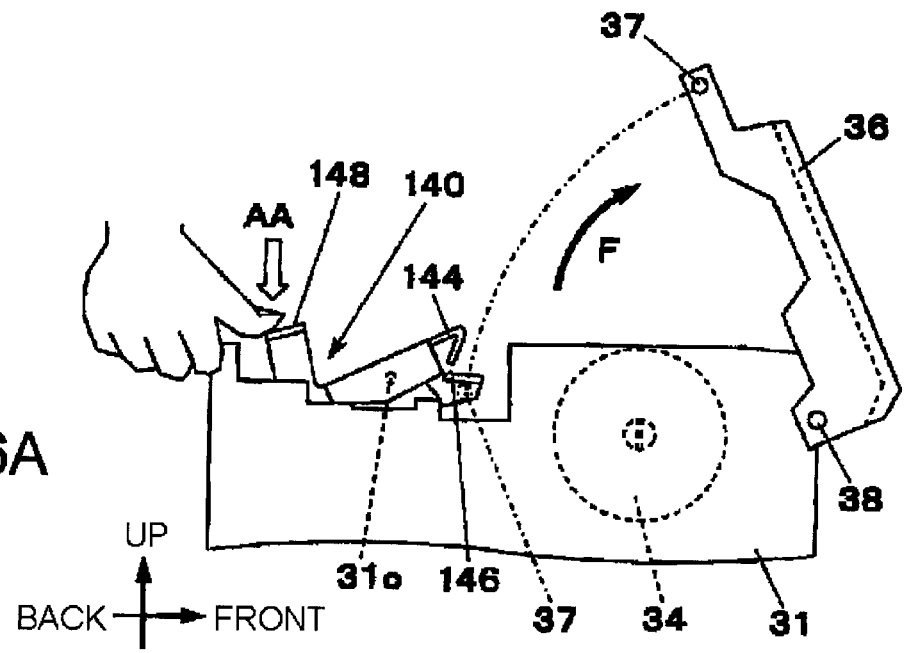
FIG. 16A is a drawings illustrating a state in which a tape presser of the tape feeder of the second embodiment of the present invention has opened up from a close position and FIG. 16B is a drawing illustrating a state in which the tape presser is in the close position.

The operator OP periodically performs maintenance operation of eliminating dirt adhering to interior surfaces of the tape presser 36. As illustrated in FIG. 16A, the operator OP downwardly pushes the operation portion 148 of the tape presser operation member 140, switching the tape presser operation member 140 from the fixed position to the unfixed position. While the rear end of the tape presser 36 is released from the pressure (as designated by arrow AA illustrated in the drawing), the tape presser 36 is swung (as designated by arrow F in the drawing) to the position (hereinafter referred to as an "open position") where the tape presser 36 is widely opened with respect to the feeder bottom support 31. As a result, the interior surfaces of the tape presser 36 become exposed, so that the operator OP can readily perform maintenance of the tape presser 36.

Figure 16B:
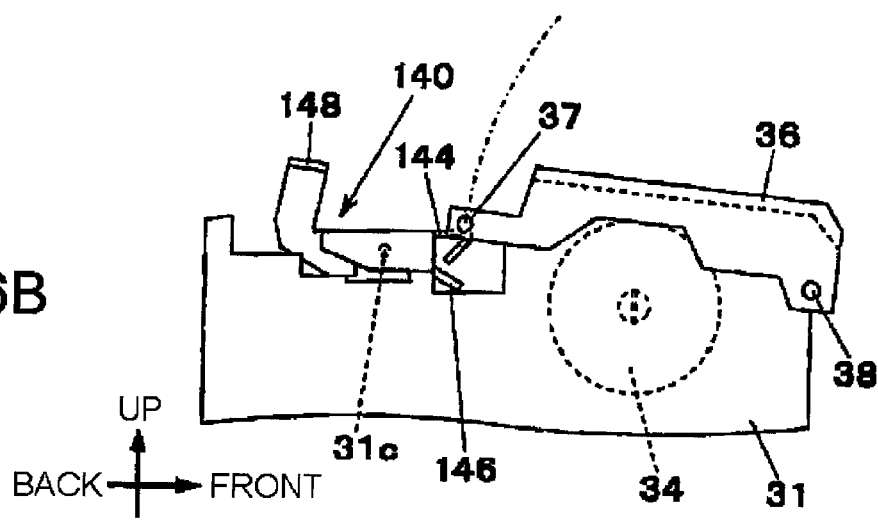

As above, during maintenance operation, the tape presser operation member 140 is swung from the fixed position to the unfixed position, whereupon the tape presser 36 is swung from the close position to the open position where the tape presser 36 is widely opened. During swinging action of the tape presser 36, the press portion 144 of the tape presser member 140 does not interfere with the tape presser 36 (in detail, the press receiving shaft 37 of the tape presser 36) (FIG. 16A). In contrast, while the tape presser operation member 140 is placed at the fixed position, the press portion 144 of the tape press operation member 140 interferes with the tape presser 36 (FIG. 16B) that swings toward the close position from the position (the open position, for instance) where the tape presser is opened with respect to the feeder bottom support 31.

Specifically, in the present embodiment, the press portion 144 of the tape presser operation member 140 assumes a shape such that the press portion 144 does not interfere with the tape presser 36, which swings from the close position in a direction of opening with respect to the feeder bottom support 31, while the tape presser operation member 140 is situated at the unfixed position and that the press portion 144 interferes with the tape presser 36, which swings toward the close position from a position where the tape presser 36 is opened with respect to the feeder bottom support 31, while the tape presser operation member 140 is situated at the fixed position.

Therefore, even in a case where the operator OP forgot to fix the tape presser operation member 140 to the close position of the tape presser 36 when newly attaching the carrier tape 21 to the tape feeder 113, the operator OP realizes his/her erroneous operation by viewing a lift in the rear end of the tape presser 36 with respect to the feeder bottom support 31. Moreover, if there is adopted a configuration of detecting a lift, from the feeder bottom support 31, in the rear end of the tape presser 36 by means of an optical sensor from the right-left direction of the feeder bottom support 31 and issuing an alarm for an error status when the tape feeder 113 attempts to start feeding the carrier tape 21 (operation of the sprocket drive motor 33) in such a state, the operator OP will recognize his/her erroneous operation more reliably.

As is the case with the tape feeder 13 described in the first embodiment, even in the tape feeder 113 described in the second embodiment, the tape presser mechanism 39 that presses the carrier tape 21 toward the feeder bottom support 31 is configured of the tape presser 36 that is at one end pivotally supported by the feeder bottom support 31 and swingable with respect to the feeder bottom support 31 and that presses the carrier tape 21 toward the sprocket 34 while positioned at the close position where the tape feeder 36 is closed with respect to the feeder bottom support 31. The tape presser mechanism 39 is further configured of the tape presser operation member 140 that is swingably attached to the feeder bottom support 31 and that swings between the fixed position where the tape presser 36 is fixed to the close position with its other end pressed toward the feeder bottom support 31 and the unfixed position where the other end of the tape feeder 36 is released from the pressure. The tape presser 36 and the tape presser operation member 140 for actuating the tape presser 36 are configured separately from each other. Consequently, force required to operate the tape presser 36 in a direction of opening with respect to the feeder bottom support 31 can be diminished, and operation for bringing the carrier tape 21 into engagement with the sprocket 34 is facilitated, thereby enabling enhancement of workability.

Incidentally, in the tape feeder 113 described in the second embodiment, the tape presser 36 can widely open with respect to the feeder bottom support 31, which would be regulated by the regulation section 46 of the tape presser operation member 40 in the first embodiment. Hence, maintenance operation can be readily performed.

The present application is based on Japanese Patent Application No. 2012-259345 filed on Nov. 28, 2012, and Japanese Patent Application No. 2013-106883 filed on May 21, 2013, and the content thereof is included here for reference.

INDUSTRIAL APPLICABILITY

There is provided a tape feeder that enables easy attachment of a carrier tape and enhancement of workability.

REFERENCE SIGNS LIST

13 TAPE FEEDER
21 CARRIER TAPE
21b SPROCKET HOLE
31 FEEDER BOTTOM SUPPORT
33 SPROCKET DRIVE MOTOR (SPROCKET DRIVE SECTION)
34 SPROCKET
34p FEED PIN
36 TAPE PRESSER
39 TAPE PRESSER MECHANISM
40 TAPE PRESSER OPERATION MEMBER
44 PRESS PORTION
45 LIFT PORTION
46 REGULATION PORTION
49, 149 BIASING SPRING (BIASING MEMBER)
SP TAPE INSERT SPACE

The invention claimed is:

1. A tape feeder that rotates a sprocket with feed pins of an outer circumference of the sprocket engaged with sprocket holes of a carrier tape to feed the carrier tape, the tape feeder comprising:
a feeder bottom support that rotatably holds the sprocket and that has a sprocket drive section that rotationally drives the sprocket; and
a tape presser mechanism that presses the carrier tape toward the feeder bottom support, wherein
the tape presser mechanism includes
a tape presser that is at one end pivotally supported by the feeder bottom support and swingable with respect to the feeder bottom support and that presses the carrier tape toward the sprocket while situated at a close position where the tape presser is closed with respect to the feeder bottom support, and
a tape presser operation member that is swingably attached to the feeder bottom support and that swings between a fixed position where the tape presser operation member presses the other end of the tape presser toward the feeder bottom support to fix the tape presser at the close position and an unfixed position where the other end of the tape feeder is released from pressure, and,
when the tape presser operation member is swung to the unfixed position from the fixed position, the tape presser operation member applies an upward force to the other end of the tape presser and lifts up the other end of the tape presser to form a carrier tape insertion space that enables insertion of the carrier tape between the tape presser and the feeder bottom support.

2. The tape feeder according to claim 1, wherein an end of the tape presser operation member near the other end of the tape presser is forced downwardly by a biasing member provided between the feeder bottom support and the tape presser operation member, and the end of the tape presser operation member has a press portion that presses the other end of the tape presser and a lift portion that lifts the other end of the tape presser.

3. The tape feeder according to claim 2, wherein the press portion of the tape presser operation member assumes a shape such that the press portion does not interfere with the tape presser which swings from the close position in a direction of opening with respect to the feeder bottom support while the tape presser operation member is situated at the unfixed position and that the press portion interferes with the tape presser which swings toward the close position from a position where the tape presser is opened with respect to the feeder bottom support while the tape presser operation member is situated at the fixed position.

4. The tape feeder according to claim 1, wherein
the tape presser operation member includes a regulation portion, and
wherein when the tape presser operation member is in the unfixed position the tape presser is movable in a direction of opening with respect to the feeder bottom support to a position wherein the tape presser comes into contact with the regulation portion.

5. The tape feeder according to claim 2, wherein the other end of the tape presser is free to pivot away from the sprocket and past the tape presser operation member.

6. A tape feeder that rotates a sprocket with feed pins of an outer circumference of the sprocket engaged with sprocket holes of a carrier tape to feed the carrier tape, the tape feeder comprising:
a feeder bottom support that rotatably holds the sprocket and that has a sprocket drive section that rotationally drives the sprocket; and
a tape presser mechanism that presses the carrier tape toward the feeder bottom support, wherein the tape presser mechanism includes
a tape presser that is at one end pivotally supported by the feeder bottom support and swingable with respect to the feeder bottom support and that presses the carrier tape toward the sprocket while situated at a close position where the tape presser is closed with respect to the feeder bottom support, and
a tape presser operation member that is swingably attached to the feeder bottom support and that swings between a fixed position where the tape presser operation member presses the other end of the tape presser toward the feeder bottom support to fix the tape presser at the close position and an unfixed position where the other end of the tape feeder is lifted up when the tape presser operation member applies an upward force to the other end of the tape feeder and is released from pressure, and, when the tape presser operation member is situated at the unfixed position, the tape presser and the feeder bottom support form a space for carrier tape insertion.

* * * * *